United States Patent
Koiwa

(10) Patent No.: US 9,117,769 B2
(45) Date of Patent: Aug. 25, 2015

(54) PLASMA ETCHING METHOD

(71) Applicant: TOKYO ELECTRON LIMITED, Tokyo (JP)

(72) Inventor: Kousuke Koiwa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/480,109

(22) Filed: Sep. 8, 2014

(65) Prior Publication Data

US 2014/0377960 A1 Dec. 25, 2014

Related U.S. Application Data

(63) Continuation-in-part of application No. 12/861,270, filed on Aug. 23, 2010, now abandoned.

(60) Provisional application No. 61/242,594, filed on Sep. 15, 2009.

(30) Foreign Application Priority Data

Aug. 27, 2009 (JP) ................................. 2009-196431

(51) Int. Cl.
*C03C 15/00* (2006.01)
*H01L 21/311* (2006.01)
*H01J 37/32* (2006.01)

(52) U.S. Cl.
CPC ..... *H01L 21/31138* (2013.01); *H01J 37/32449* (2013.01); *H01L 21/31122* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 5,017,403 A | 5/1991 | Pang et al. | |
| 5,242,539 A | 9/1993 | Kumihashi et al. | |
| 5,362,356 A | 11/1994 | Schoenborn | |
| 5,378,316 A | 1/1995 | Franke et al. | |
| 5,605,637 A | 2/1997 | Shan et al. | |
| 6,482,744 B1 | 11/2002 | Wu | |

(Continued)

FOREIGN PATENT DOCUMENTS

| | | |
|---|---|---|
| JP | 2003-163205 A | 6/2003 |
| JP | 2004-214465 A | 7/2004 |

(Continued)

OTHER PUBLICATIONS

Reis et al (Deep Reactive Ion Etching), Mar. 16, 2004, Reis.

(Continued)

*Primary Examiner* — Binh X Tran
*Assistant Examiner* — David Cathey, Jr.
(74) *Attorney, Agent, or Firm* — Rothwell, Figg, Ernst & Manbeck, P.C.

(57) ABSTRACT

In a plasma etching method of performing a plasma etching on an amorphous carbon layer of a substrate to be processed by using an inorganic film as a mask, the substrate being mounted in a processing chamber, the plasma etching on the amorphous carbon layer is performed by using $O_2$ gas as a processing gas and the $O_2$ gas to flow in the processing chamber such that a residence time of the $O_2$ gas becomes 0.37 msec or less. The amorphous carbon layer is used as an etching mask of an etching target film formed on the substrate. The plasma etching is performed by using the $O_2$ gas only.

8 Claims, 7 Drawing Sheets

(56) References Cited

U.S. PATENT DOCUMENTS

| | | | |
|---|---|---|---|
| 6,635,185 B2 | 10/2003 | Demmin et al. | |
| 6,913,868 B2 * | 7/2005 | Bencher et al. | 430/296 |
| 6,951,709 B2 * | 10/2005 | Li | 430/316 |
| 7,079,740 B2 * | 7/2006 | Vandroux et al. | 385/129 |
| 2007/0020936 A1 | 1/2007 | Abatchev et al. | |
| 2008/0003798 A1 | 1/2008 | Hwang | |
| 2011/0049098 A1 | 3/2011 | Koiwa | |

FOREIGN PATENT DOCUMENTS

| | | |
|---|---|---|
| JP | 2007-180358 A | 7/2007 |
| JP | 2008-47810 A | 2/2008 |
| JP | 2011-49360 A | 3/2011 |

OTHER PUBLICATIONS

Mack, Lithography, Mar. 4, 2006, lithoguru.com, p. 1-17.

Goodyear et al, High resolution inductively coupled plasma etching of 30 nm lines and spaces in tungsten and silicon, 2000, J. Vac. Sci. Technol., B 18 (6) Nov./Dec., p. 3471-3475.

Bhattacharya, Deep Reactive Ion Etching (DRIE), Mar. 16, 2014, UMD, ten pages total.

* cited by examiner

FIG.4

| HOLE DIAMETER (ASPECT RATIO) | | O₂ FLOW RATE = 130sccm Rt= 10.55msec | O₂ FLOW RATE = 450sccm Rt= 3.05msec | O₂ FLOW RATE = 900sccm Rt= 1.52msec | O₂ FLOW RATE = 1350sccm Rt= 1.02msec |
|---|---|---|---|---|---|
| 50nm (BEYOND 13) | △CD[nm] | 65 | 62 | — | 58 |
|  | 3σ[nm] | 59.9 | 49.7 |  | 54.6 |
|  | σ/Ave. |  |  |  |  |
| 100nm (ABOUT 7) | △CD[nm] | 55 | 47 | — | 49 |
|  | 3σ[nm] | 53.1 | 39.7 |  | 42.5 |
|  | σ/Ave. |  |  |  |  |
| 120nm (ABOUT 6) | △CD[nm] | 87 | — | 46 | — |
|  | 3σ[nm] | 65.2 |  | 38.1 |  |
|  | σ/Ave. | 0.13 |  | 0.10 |  |
| 180nm (ABOUT 4) | △CD[nm] | 92 | — | 51 | — |
|  | 3σ[nm] | 83.3 |  | 40.5 |  |
|  | σ/Ave. | 0.11 |  | 0.07 |  |

FIG. 7

| | | O₂ FLOW RATE = 130sccm Rt= 10.55msec | O₂ FLOW RATE = 450sccm Rt= 3.05msec | O₂ FLOW RATE = 900sccm Rt= 1.52msec |
|---|---|---|---|---|
| INITIAL 120nm Partial | TOP CD[nm] | 113 | 130 | 108 |
| | MAXIMUM CD[nm] | 176 | 158 | 133 |
| | BOTTOM CD[nm] | 115 | 128 | 110 |
| | AVERAGE CD(Ave.)[nm] | 147.5 | 144.3 | 134.4 |
| | 3σ[nm] | 51.4 | 26.5 | 21.6 |
| | σ/Ave. | 0.12 | 0.06 | 0.05 |
| INITIAL 120nm OE 30% | TOP CD[nm] | 118 | — | 100 |
| | MAXIMUM CD[nm] | 211 | — | 145 |
| | BOTTOM CD[nm] | 133 | — | 100 |
| | AVERAGE CD(Ave.)[nm] | 170.8 | — | 130.1 |
| | 3σ[nm] | 65.08 | — | 33.88 |
| | σ/Ave. | 0.13 | — | 0.10 |
| INITIAL 180nm Partial | TOP CD[nm] | 151 | 186 | 181 |
| | MAXIMUM CD[nm] | 248 | 206 | 201 |
| | BOTTOM CD[nm] | 183 | 176 | 188 |
| | AVERAGE CD(Ave.)[nm] | 219.6 | 105.3 | 198.2 |
| | 3σ[nm] | 51.5 | 21.5 | 11.8 |
| | σ/Ave. | 0.08 | 0.03 | 0.02 |
| INITIAL 180nm OE 30% | TOP CD[nm] | 191 | — | 166 |
| | MAXIMUM CD[nm] | 304 | — | 221 |
| | BOTTOM CD[nm] | 211 | — | 176 |
| | AVERAGE CD(Ave.)[nm] | 260.0 | — | 204.2 |
| | 3σ[nm] | 82.8 | — | 40.2 |
| | σ/Ave. | 0.11 | — | 0.07 |

PLASMA ETCHING METHOD

CROSS-REFERENCE TO RELATED APPLICATIONS

This application is a Continuation-In-Part of and is based upon and claims the benefit of priority from co-pending U.S. application Ser. No. 12/861,270, filed Aug. 23, 2010, and also claims the benefit of priority from U.S. provisional application Ser. No. 61/242,594, filed Sep. 15, 2009. The present application is further based upon and claims the benefit of priority from Japanese Patent Application No. 2009-196431, filed Aug. 27, 2009. The entire contents of foregoing applications are incorporated herein by reference.

FIELD OF THE INVENTION

The present invention relates to a plasma etching method for performing a plasma etching on an amorphous carbon layer.

BACKGROUND OF THE INVENTION

In the manufacturing process of a semiconductor device, it is required to perform an etching so as to form hole patterns or line patterns with a high aspect ratio in response to the demand for the scaling-down of a design rule. There has been disclosed a technique for such high aspect-ratio etching, e.g., a method for using a mask (multi-layered resist) having a structure where inorganic films and organic films are deposited below an ArF resist. As such a lower organic film, an amorphous carbon layer having a high etching resistance is employed.

Typically, $O_2$ gas is employed as an etching gas when a carbon-based organic film, e.g., an amorphous carbon layer, is etched by using an inorganic film as a mask (see, e.g., Japanese Patent Application Publication No. 2004-214465).

However, when hole patterns or line patterns are formed by etching an amorphous carbon layer with a plasma of $O_2$ gas, such etching is performed in both vertical and horizontal directions, thereby making errors such as bowings in etched shapes or enlarging hole diameters or line widths beyond the designed values. If such errors are made in a specific film, errors are also made in a target film to be etched when the etching is performed on the target film by using the specific film as a mask.

There has been known a method for reducing the generation of the errors by adding COS gas. However, it may be difficult to use the COS gas due to residues made from the COS gas, and the like. Accordingly, it is required to find a method for obtaining satisfactorily etched shapes by using $O_2$ gas only.

SUMMARY OF THE INVENTION

In view of the above, the present invention provides a plasma etching method capable of satisfactorily etching an amorphous carbon layer without enlarging etched portions thereof.

In accordance with an aspect of the present invention, there is provided a plasma etching method of performing a plasma etching on an amorphous carbon layer of a substrate to be processed by using an inorganic film as a mask, wherein the substrate is mounted in a processing chamber. The method includes performing the plasma etching on the amorphous carbon layer by using $O_2$ gas as a processing gas and the $O_2$ gas to flow in the processing chamber such that a residence time of the $O_2$ gas becomes 3.05 msec or less.

Preferably the residence time is from 1.02 msec to 3.05 msec, and more preferably from 1.52 msec to 3.05 msec.

In accordance with another aspect of the present invention, there is provided a computer-readable storage medium storing a computer-readable program for controlling a plasma etching apparatus to execute the plasma etching method.

BRIEF DESCRIPTION OF THE DRAWINGS

The objects and features of the present invention will become apparent from the following description of embodiments, given in conjunction with the accompanying drawings, in which:

FIG. 4 is a table showing $\Delta CD$, $3\sigma$, and $\sigma/Ave.$ when an amorphous carbon layer is etched by changing an initial hole diameter and a residence time;

FIG. 7 is a table showing indexes of shapes and sizes of holes when an amorphous carbon is etched by setting an initial hole diameter to 120 and 180 nm while changing a residence time.

DETAILED DESCRIPTION OF THE EMBODIMENTS

An embodiment of the present invention will now be described in detail with reference to the accompanying drawings which form a part hereof.

Figure 1:
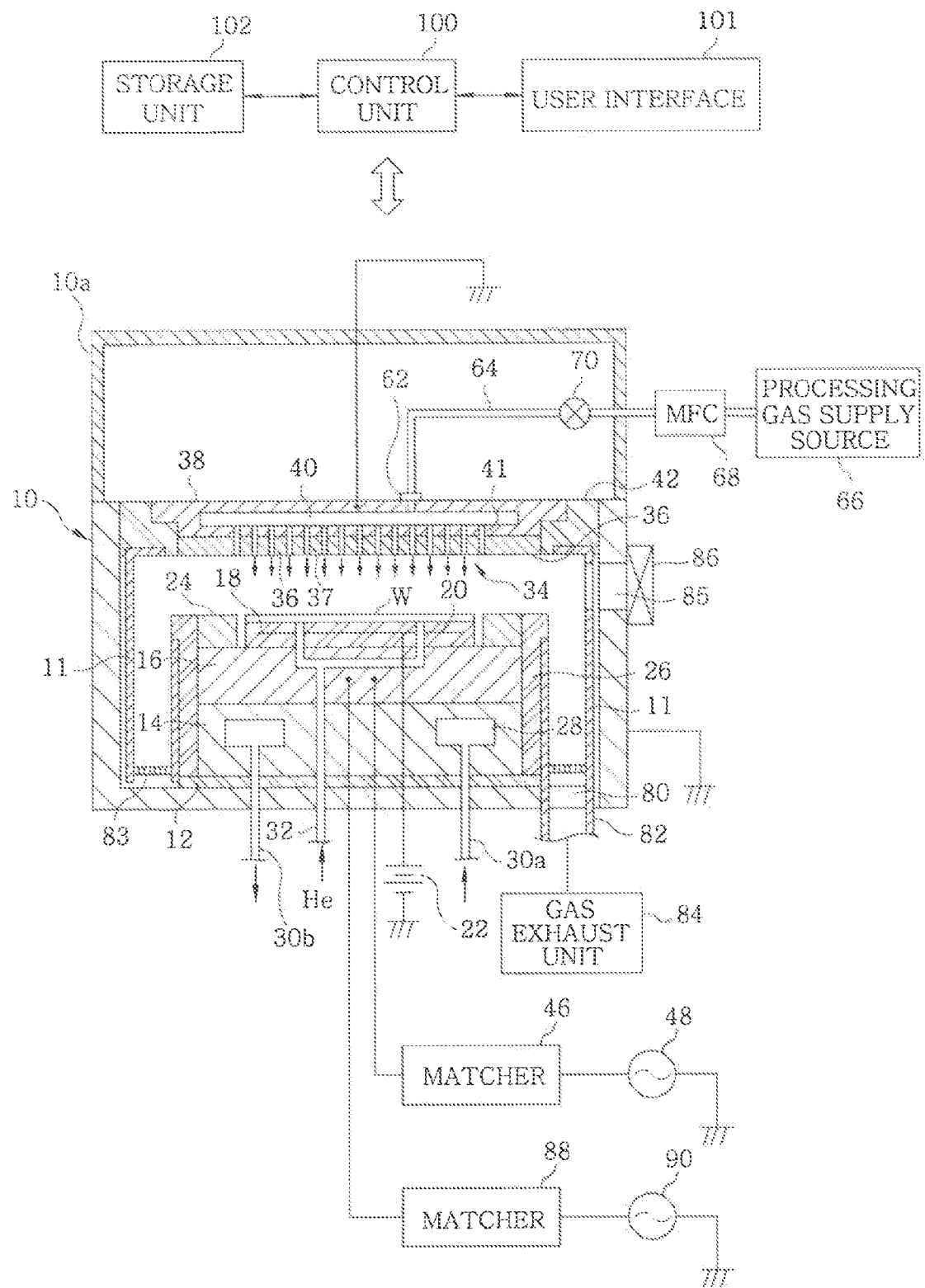
FIG. 1 is a schematic cross sectional view showing a plasma etching apparatus capable of performing a plasma etching method in accordance with an embodiment of the present invention.

FIG. 1 is a schematic cross sectional view showing an example of a plasma etching apparatus for performing a plasma etching method in accordance with an embodiment of the present invention.

The plasma etching apparatus is a capacitively coupled parallel plate type etching apparatus and includes a substantially cylindrical chamber (processing vessel) 10 made of, e.g., aluminum whose surface is anodically oxidized. The chamber 10 is frame-grounded.

At a bottom portion of the chamber 10, a substantially cylindrical susceptor support 14 is provided via an insulating plate 12 made of, e.g., ceramic or the like. Further, a susceptor 16 made of, e.g., aluminum is provided on the susceptor support 14. The susceptor 16 serves as a lower electrode, and a target substrate, e.g., a semiconductor wafer W, to be processed is mounted on the susceptor 16. Formed on the semiconductor wafer W is an amorphous carbon layer (film) which is a target object to be etched in accordance with the present embodiment.

On an upper surface of the susceptor 16, an electrostatic chuck 18 for attracting and holding the semiconductor wafer W by an electrostatic force is provided. The electrostatic chuck 18 includes a pair of insulating layers or sheets and an electrode interposed therebetween, the electrode being made of an electrically conductive film. A DC power supply 22 is electrically connected to the electrode 20. The semiconductor wafer W is attracted to and held on the electrostatic chuck 18 by the electrostatic force, e.g., a Coulomb force generated by a DC voltage supplied from the DC power supply 22.

An electrically conductive focus ring (calibration ring) 24 is arranged on an upper peripheral portion of the susceptor 16 to surround the electrostatic chuck 18 (the semiconductor wafer W). The focus ring 24 is made of, e.g., silicon or the like, to thereby improve an in-plane uniformity of etching.

A coolant path 28 is arranged in the susceptor support 14, e.g., in a circumferential direction. A coolant, e.g., cooling water, of a predetermined temperature is supplied via lines 30a and 30b from a chiller unit (not shown) provided outside to be circulated in the coolant path 28. With the temperature of the coolant, it is possible to control the processing temperature of the semiconductor wafer W on the susceptor 16.

A heat transfer gas, e.g., He gas, is supplied via, e.g., a He gas supply line 32 to a gap between a top surface of the electrostatic chuck 18 and a backside surface of the semiconductor wafer W.

An upper electrode 34 is provided above the susceptor 16 serving as the upper electrode to face the susceptor 16 in parallel. A space between the upper and the lower electrode 34 and 16 serves as a plasma generation space. The upper electrode 34 has a facing surface which faces the semiconductor wafer W on the susceptor (lower electrode) 16 and is brought into contact with the plasma generation space.

The upper electrode 34 is held at an upper portion of the chamber 10 by an insulating shield member 42 and includes an electrode plate 36 having a plurality of gas injection holes 37, the electrode plate 36 having the facing surface that faces the susceptor 16; and an electrode support 38 having a water-cooling structure for releasably holding the electrode plate 36, the electrode support 38 being made of a conductive material, e.g., aluminum. The electrode plate 36 is preferably made of a low-resistance conductor or semiconductor material having low joule heat. Further, in order to reinforce a resist film, the electrode plate 36 is preferably made of a silicon-containing material. In this respect, the electrode plate 36 is preferably made of, e.g., silicon or silicon carbide (SiC).

A gas diffusion space 40 is provided inside the electrode support 38, and a plurality of gas flow holes 41 is downwardly extended from the gas diffusion space 40 through the electrode support 38. The gas through holes communicate with the respective gas injection holes 37.

A gas inlet port 62 is formed in the electrode support to introduce a processing gas into the gas diffusion space 40. A gas supply line 64 is connected to the gas inlet port 62, and a processing gas supply source 66 is connected to the gas supply line 64 to supply $O_2$ gas as an etching gas. In the gas supply line 64, a mass flow controller (MFC) (or a flow control system (FCS)) 68 and an on-off valve 70 are sequentially provided from an upstream side of the gas supply line 64.

For etching an amorphous carbon layer, the $O_2$ gas is supplied from the processing gas supply source 66 to the gas diffusion space 40 through the gas supply line 64. The supplied $O_2$ gas is injected in the form of shower into the plasma generation space through the gas flow holes 41 and the gas injection holes 37. In other words, the upper electrode 34 serves as a shower head through which a processing gas is supplied. Further, the upper electrode 34 is grounded. However, in case that the plasma etching apparatus of the present embodiment is also used to etch another film, a DC power supply may be connected to the upper electrode 34.

A cylindrical grounding conductor 10a is provided to extend from a sidewall of the chamber 10 more upwardly than the height of the upper electrode 34.

A first high frequency power supply 48 is electrically connected, via a first matcher 46, to the susceptor 16 serving as the lower electrode. The first high frequency power supply 48 outputs a high frequency power of a frequency in the range between 27 and 100 MHz, e.g., about MHz. The first matcher 46 serves to adjust a load impedance to an inner (or output) impedance of the first high frequency power supply 48 such that the load impedance and the output impedance become seemingly identical to each other when a plasma is generated in the chamber 10.

A second high frequency power supply 90 is electrically connected, via a second matcher 88, to the susceptor 16 serving as the lower electrode. A high frequency bias power is applied to the semiconductor wafer W by supplying a high frequency power from the second high frequency power supply 90 to the susceptor (lower electrode) 16, so that ions are attracted to the semiconductor wafer W.

The second high frequency power supply 90 outputs a high frequency power of a frequency in the range between 400 kHz and 20 MHz, e.g., about 13 MHz. The second matcher 88 serves to adjust a load impedance to an inner (or output) impedance of the second high frequency power supply 90 such that, when a plasma is generated in the chamber 10, the inner impedance and the load impedance including an impedance corresponding to the generated plasma become seemingly identical to each other.

A gas exhaust port 80 is provided at a bottom portion of the chamber 10, and a gas exhaust unit 84 is connected to the gas exhaust port 80 via a gas exhaust line 82. The exhaust unit 84 includes a vacuum pump such as a turbo molecular pump to depressurize the inside of the chamber 10 to a desired vacuum level. Provided on a sidewall of the chamber 10 is a loading/unloading port 85 through which the semiconductor wafer W is loaded and unloaded. The loading/unloading port 85 can be opened and closed by a gate valve 86.

To prevent etching byproducts (deposits) from being deposited on the chamber 10, a deposition shield 11 is detachably provided along the sidewall of the chamber 10. In other words, the deposition shield 11 serves as a wall of the chamber 10. The deposition shield 11 is further provided on an outer periphery of an inner wall member 26.

At a lower portion of the chamber 10, an exhaust plate 83 is provided between the deposition shields 11 at the wall of the chamber 10 and at the inner wall member 26 side. An aluminum member coated with ceramic such as $Y_2O_3$ may adequately be employed as the deposition shield 11 and the exhaust plate 83.

Various elements, such as a power supply system, a gas supply system, and a driving system, i.e., the first and the second high frequency power 48 and 90, the matchers 46 and the like, in the plasma etching apparatus are connected to a control unit (general control device) 100 including a microprocessor (computer) to be controlled thereby. A user interface 101 is also connected to the control unit 100. The user interface 101 includes a keyboard through which a command is inputted to manage the plasma etching apparatus and a display unit for visually displaying an operation status of the plasma etching apparatus.

Further connected to the control unit 100 is a storage unit 102 for storing a control program for performing various operations in the plasma etching apparatus under the control of the control unit 100 and a program, i.e., a processing recipe, for performing the processes of the components of the plasma etching apparatus in accordance with the processing conditions. The processing recipe is stored in a storage medium (not shown) of the storage unit 102. The storage medium may be a hard disk drive or a semiconductor memory, or a portable unit such as a CDROM, a DVD, and a flash memory. In addition, the recipe may adequately be transmitted from another device through, e.g., a dedicated line.

Moreover, as necessary, when receiving an instruction from the user interface 101, the control unit 100 calls a corresponding processing recipe from the storage unit 102 and executes it, so that a desired operation in the plasma etching apparatus is performed under the control of the control unit 100.

Next, the plasma etching method of the present embodiment to be performed by such a plasma etching apparatus will be described.

Figure 2:
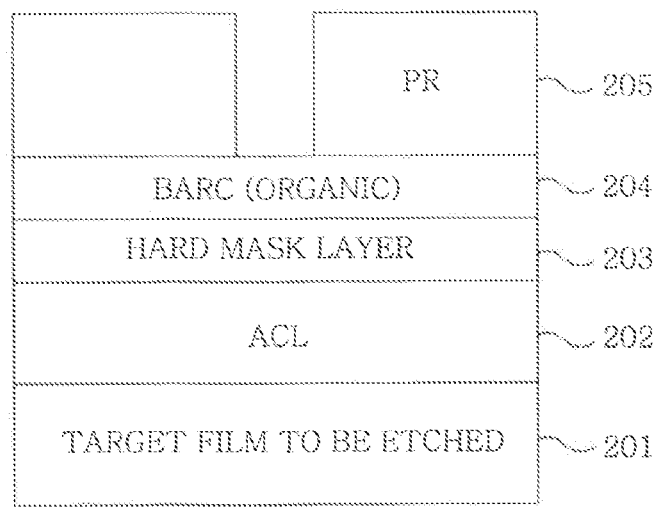
FIG. 2 schematically shows an example of a structure of a semiconductor wafer to which the plasma etching method in accordance with the embodiment of the present invention is applied.

In accordance with the present embodiment, the semiconductor wafer W having a structure shown in FIG. 2 is taken as an example of a target substrate to be processed. The semiconductor wafer W includes a final etching target film 201; an amorphous carbon layer (ACL) 202 serving as an etching mask of the final etching target film 201; an inorganic hard mask layer 203, made of SiON or the like, serving as an etching mask of the amorphous carbon layer 202; an organic bottom anti-reflection coating (BARC) film 204; and a photoresist film 205 having a predetermined pattern, which is are sequentially formed in that order. Such a multi-layered resist structure having the layers 202 to 205 provided above the final etching target film 201 is employed to etch the final etching target film 201, and the amorphous carbon layer 202 serving as a mask for etching the final etching target film 201 becomes a target film to be etched in the multi-layered resist structure.

Specifically, in the structure shown in FIG. 2, the BARC film 204 and the hard mask layer 203 are first etched by using the photoresist film 205 as a mask. Then, the amorphous carbon layer 202 serving as a target film in the present embodiment is etched by using the hard mask layer 203. As described above, the etched amorphous carbon layer 202 serves as a mask for etching the final etching target film 201. The etched amorphous carbon layer 202 has a thickness ranging from about 100 to 1000 nm.

Preferably, a $SiO_2$ film may be employed as the final etching target film 201. As the hard mask layer 203, a SiN film, a $SiO_2$ film, an SOG film, or the like as well as a SiON film may be employed. The hard mask layer 203 has a thickness ranging from about 10 to 100 nm. As the BARC film 204, a SiON film or an organic film having a thickness ranging from about 20 to 100 nm may be employed. Typically, an ARF resist film having thickness ranging from about 100 to 400 nm is employed as the photoresist film 205.

First, the gate valve 86 is opened, and the semiconductor wafer W is loaded into the chamber 10 through the loading/unloading port 85 to be mounted on the susceptor 16, the semiconductor wafer W having a structure in which the BARC film 204 and the hard mask layer 203 have been etched from the structure shown in FIG. 2. Then, the chamber 10 is exhausted by the gas exhaust unit 84, and a processing gas is supplied at a predetermined flow rate from the processing gas supply source 66 to the gas diffusion space 40. Then, the pressure inside the chamber 10 is set to a predetermined level, e.g., 30 mTorr (4 Pa) or less, while supplying the processing gas to the chamber 10 through the gas flow holes 41 and the gas injection holes 37.

Then, a plasma etching is performed on the amorphous carbon layer 202 by supplying $O_2$ gas as the processing gas while supplying to the susceptor 16 serving as the lower electrode a plasma-generating high frequency power having a relatively high frequency ranging from 27 to 100 MHz, e.g., 40 MHz from the first high frequency power supply 48; and a high frequency bias power, i.e., an ion-attraction high frequency power, having a frequency ranging from 400 kHz to 20 MHz, e.g., 13 MHz, that is lower than that of the plasma-generating high frequency power, from the second high frequency power supply 90. However, if a self bias power from the first high frequency power supply 48 satisfactorily serves as the high frequency bias power, it becomes unnecessary to supply the high frequency bias power from the second high frequency power supply 90.

When a plasma is generated, a DC voltage is supplied from the DC power supply 22 to the electrode 20 of the electrostatic chuck 18 so that the wafer W is attracted to and held on the electrostatic chuck 18.

The $O_2$ gas injected through the gas injection holes 37 formed in the electrode plate 36 of the upper electrode 34 is converted into a plasma by the glow discharge generated between the upper electrode 34 and the susceptor (lower electrode) 16 by the high frequency power. By using $O_2$ ions and/or O radicals produced from the plasma, the plasma etching is performed on the amorphous carbon layer 202.

When the plasma etching is performed on the amorphous carbon layer 202 by employing the inorganic hard mask layer 203 as a mask and using $O_2$ gas only, the plasma etching is performed in both vertical and horizontal directions, thereby making errors such as bowings in etched shapes or enlarging hole diameters or line widths beyond designed values. It is considered that such horizontal directional etching is performed by O radicals. The O radicals are produced by dissociation of the $O_2$ gas in the plasma. Accordingly, if it is possible to suppress the dissociation of the $O_2$ gas into the O radicals, it is possible to suppress the horizontal directional etching.

To suppress the dissociation of $O_2$ into the O radicals, it is effective to shorten a residence time of $O_2$, i.e., a time during which the $O_2$ gas resides in the chamber 10. In other words, as the residence time of the $O_2$ gas becomes longer, the chance that the $O_2$ gas is dissociated into the O radicals is increased and, thus, more O radicals are produced. On the contrary, if the residence time of the $O_2$ gas becomes shorter, the chance that the $O_2$ gas is dissociated into the O radicals is decreased and, thus, less O radicals are produced.

A residence time RT [sec] is computed by the following Eq. 1.

$$RT[\text{Sec}] = 9.42 \times 10^7 \{(Pr \cdot Ts)/(Ps \cdot Tr)\}(R_W^2 \cdot d)/F \qquad \text{Eq. 1,}$$

where Pr, Tr, Ps, Ts, Rw, d, and F indicate the pressure [Pa] inside the chamber, the temperature [K] of a gas inside the chamber, the standard pressure [Pa], the standard temperature [K], the radius [m] of a wafer, the distance [m] between the upper and the lower electrode, and the gas flow rate [sccm], respectively.

In the Eq. 1, the temperature Tr inside the chamber is equal to the standard temperature Ts (60° C.), and the radius Rw of the wafer is 0.15 m. The distance d between the upper and the lower electrode is set in the range between 0.001 and 0.3 m, for example, to 0.03 m (30 mm). The pressure Pr inside the chamber is set in the range of 30 mTorr (4 Pa) or less. Accordingly, what is variable in the Eq. 1 is the gas flow rate F and, thus, it is required to increase the gas flow rate F to shorten the residence time. In the present embodiment, the flow rate of the $O_2$ gas is significantly increased to minimize the amount of the O radicals, to thereby shorten the residence time to 3.05 msec or less.

Preferably the residence time is from 1.02 msec to 3.05 msec, and more preferably from 1.52 msec to 3.05 msec.

Therefore, the amount of the O radicals are reduced, thereby suppressing the horizontal directional etching, so that errors such as bowings in etched shapes and the increase of hole diameters or line widths beyond designed values can be suppressed.

In this way, the amorphous carbon layer 202 can be etched to have a satisfactory shape and high dimensional accuracy. Accordingly, by using the amorphous carbon layer 202 as a mask, the final etching target film 201 can also be etched to have a satisfactory shape and high dimensional accuracy.

As an index of the etched shape, the greatest diameter of the bowing portion has conventionally been used. However, since the average critical dimension (CD) of a hole can be changed, it is possible to more accurately ascertain the etched shape by using $\Delta CD$ as the index of the etched shape, $\Delta CD$ being obtained by subtracting top CD from bowing CD.

Even in this case, it may be difficult to accurately ascertain the etched shape if top CD is changed, for example. Accordingly, a variation value is measured by using a technique for measuring a line width roughness (LWR). Specifically, diameters or widths at a plurality of, e.g., 100, locations between a top and a bottom portion of the cross section of a hole or a line (groove) are measured to calculate $3\sigma$ ($\sigma$ indicates standard deviation) as the variation value. Then, $3\sigma$ is used as the index of the etched shape. It is determined that, as $3\sigma$ becomes smaller, the etched shape is more satisfactory. Accordingly, it is possible to accurately ascertain errors such as bowings in etched shapes. Since, however, $3\sigma$ is affected a little by the diameter of a hole, a value obtained from variable coefficient $\sigma/Ave.$ (Ave. indicates an average of hole diameters or line widths) may be used as a more accurate index of the etched shape.

Preferably, $3\sigma$ is equal to or smaller than 50 nm and $\sigma/Ave.$ is equal to or smaller than 0.1. Moreover, it is preferable that the diameter or width of a hole or a line (groove) to be formed by the etching is equal to or greater than 100 nm and an aspect ratio is equal to or smaller than 7. In this way, it is possible to stably obtain a more satisfactory etched shape with $3\sigma$ that is equal to or smaller than 50 nm and $\sigma/Ave.$ that is equal to or smaller than 0.1.

In the etching of the amorphous carbon layer 202, the flow rate of the $O_2$ gas is preferably set in the range between 500 and 3000 sccm (mL/min). Moreover, although only the $O_2$ gas can be satisfactorily employed as an etching gas, a dilution gas including a rare gas such as Ar gas or He gas may additionally be supplied as necessary.

As described above, the amorphous carbon layer 202 is singly etched by using the plasma etching apparatus shown in FIG. 1. However, in the same chamber, the organic BARC film 204 and the hard mask layer 203 such as the SiON film may be etched. In this case, a DC voltage is applied to the upper electrode of the plasma etching apparatus shown in FIG. 1, and the BARC film 204 and the SiON film 203 are etched together under, e.g., shrinking or normal conditions of a following experiment before the amorphous carbon layer 202 is etched.

Next, results of the experiment carried out for confirming the effects of the present embodiment will be described.

Figure 3:
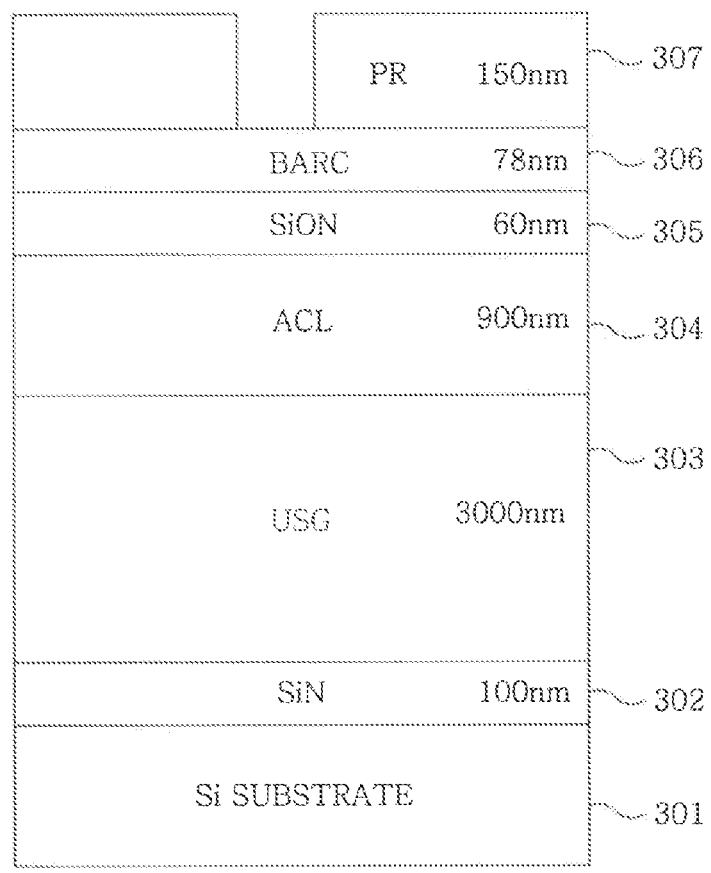
FIG. 3 schematically shows a structure of a semiconductor wafer used for an experiment that was carried out to confirm an effect of the present embodiment.

In the experiment, a semiconductor wafer having a structure shown in FIG. 3 was employed. Specifically, semiconductor wafer includes a SiN film 302 having a thickness of 100 nm serving as an etching stop film, an undoped silica glass (USG) film 303 having a thickness of 3000 nm serving as an etching target film, an amorphous carbon layer (ACL) 304 having a thickness of 900 nm, a SiON film 305 having a thickness of 60 nm serving as a hard mask layer, a BARC film 306 having a thickness of 78 nm and made of an organic material, and a photoresist film 307 having a thickness of 150 nm and made of an ARF resist, the photoresist film 307 having hole patterns of a predetermined diameter formed by photolithography, which were sequentially formed in that order on a Si substrate 301.

The hole diameters of the photoresist film 307 were set to four kinds, i.e., 100, 120, 160 and 180 nm, and CD shrink was controlled in accordance with etching conditions of the BARC 306. In the etching, initial hole diameters were set to four kinds, i.e., 50, 100, 120 and 180 nm.

Specifically, the BARC film 306 and the SiON film 305 were etched by using the photoresist films 307 having hole diameters 100 and 160 nm under the following shrinking conditions for generating CD shrink, so that the hole diameters of the SiON film 305 were respectively shrunk to 50 and 100 nm to form the initial hole diameters of 50 and 100 nm. The BARC film 306 and the SiON film 305 were etched by using the photoresist films 307 having hole diameters 120 and 180 nm under the following normal conditions for generating no CD shrink to form the initial hole diameters to 120 and 180 nm. Further, the amorphous carbon layer 304 was etched under the following conditions. The hole diameter of 50 nm corresponds to the aspect ratio of beyond 13. The hole diameters of 100, 120 and 180 nm corresponds to the aspect ratios of about 7, 6 and 4, respectively.

(Conditions of Etching BARC Film and SiON Film)

1. Shrinking Conditions

Pressure inside the chamber: 150 mTorr (20 Pa)

Power of the first high frequency power source (40 MHz): 750 W

Power of the second high frequency power source (13 MHz): 300 W

DC voltage applied to the upper electrode: −300 V

Processing gas $CHF_3$ (Flow rate: 200 sccm (mL/min)

$CF_3I$ (Flow rate: 50 sccm (mL/min)

Time: 2 min.

2. Normal Conditions

Pressure inside the chamber: 75 mTorr (10 Pa)

Power of the first high frequency power source (40 MHz): 750 W

Power of the second high frequency power source (13 MHz): 0 W

DC voltage applied to the upper electrode: −300 V

Processing gas $CF_4$ (Flow rate: 250 sccm (mL/min)

$O_2$ (Flow rate: 8 sccm (mL/min)

Time: 1 min. and 48 sec.

In the etching of the amorphous carbon layer 304, under the following common conditions, the flow rate of the $O_2$ gas was changed to 130, 450, 900 and 1350 sccm (mL/min) and the residence time was changed to 10.55, 3.05, 1.52 and 1.02 msec. Further, under the common conditions, a first sample was created by partially etching the amorphous carbon layer 304 and a second sample was created by over-etching the amorphous carbon layer 304 by 30 percentages. In addition, in the etching, the distance between the upper and the lower electrode of the plasma etching apparatus was set to 30 mm, and the temperature of a gas inside the chamber during the etching was set to about 60° C.

(Common Conditions of Etching Amorphous Carbon Layer)
Pressure inside the chamber: 2.66 Pa
Power of the first high frequency power source (40 MHz): 800 W
Power of the second high frequency power source (13 MHz): 0 W To ascertain horizontally etched levels of the samples, ΔCD was calculated by subtracting top CD from the greatest diameter due to bowing (bowing CD). In addition, hole diameters at 100 locations between the top portion and the bottom portion of a hole were measured by an image analysis of a computer to calculate 3σ (σ indicates standard deviation) as a variation value, and variable coefficient σ/Ave. was also calculated.

FIG. 4 is a table showing ΔCD, 3σ and σ/Ave. for each condition after the 30% over-etching was performed. As shown in FIG. 4, it has been confirmed that ΔCD, 3σ and σ/Ave. became smaller as the residence time Rt was shortened by increasing the flow rate of the $O_2$ gas. The effect of improving ΔCD, 3σ and σ/Ave. was confirmed when the residence time Rt was 3.05 msec or less. When, however, the flow rate of the $O_2$ gas was 1350 sccm (mL/min), ΔCD, 3σ and σ/Ave. were slightly increased.

It has also been confirmed that the satisfactory effect of improving the etched shape such as bowing was obtained in the case of the initial hole diameter of 100 nm or more; and the aspect ratio of a hole was preferably equal to or smaller than 7. Especially, in the case of the initial hole diameter of 120 and 180 nm, a distinguishably satisfactory effect was obtained.

Next, the etching results of the initial hole diameters of 120 and 180 nm will be described in detail.

Figure 5:
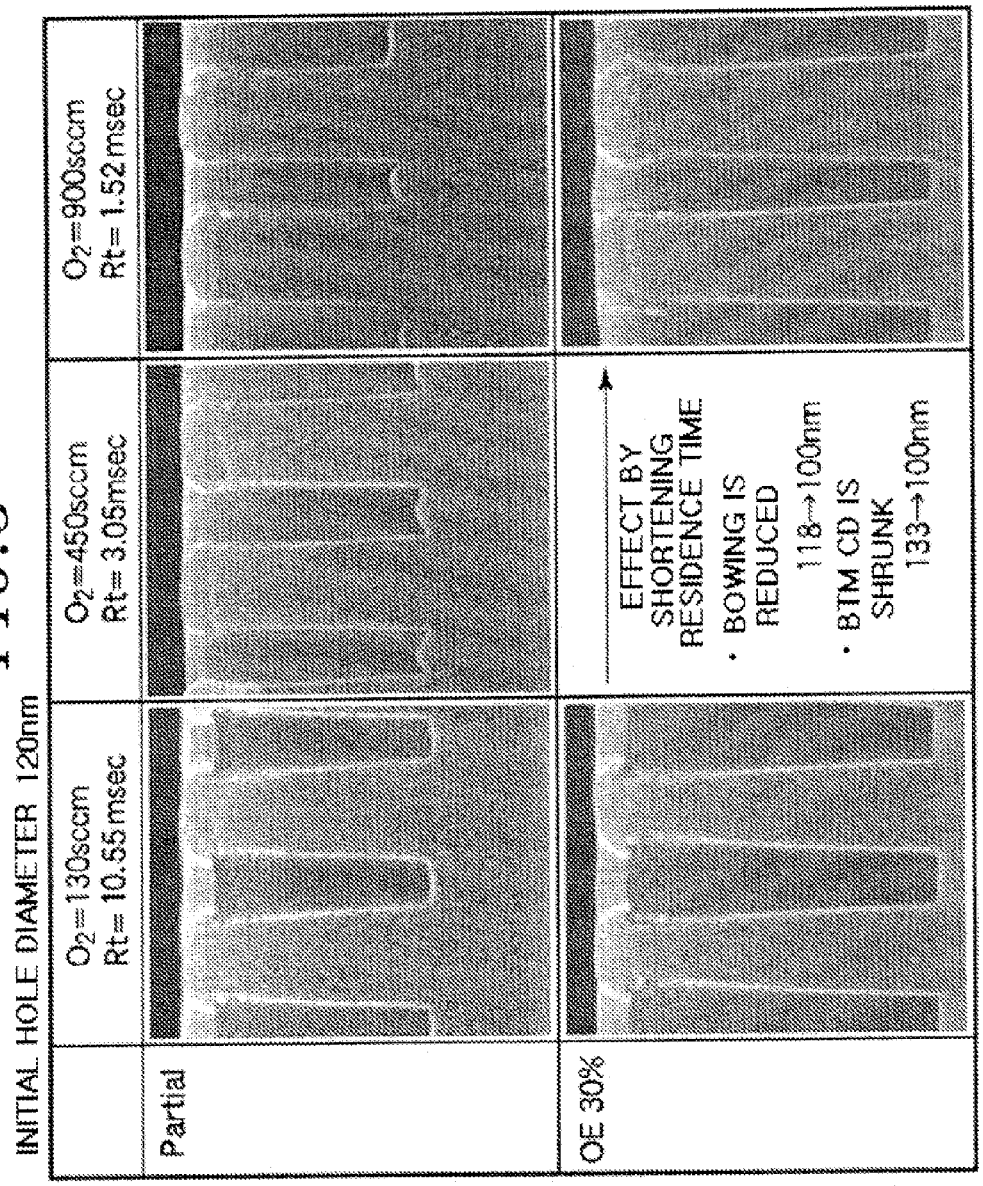
FIG. 5 shows scanning electron microscope pictures of etching holes when an amorphous carbon is etched by setting an initial hole diameter as 120 nm while changing a residence time.
Figure 6:
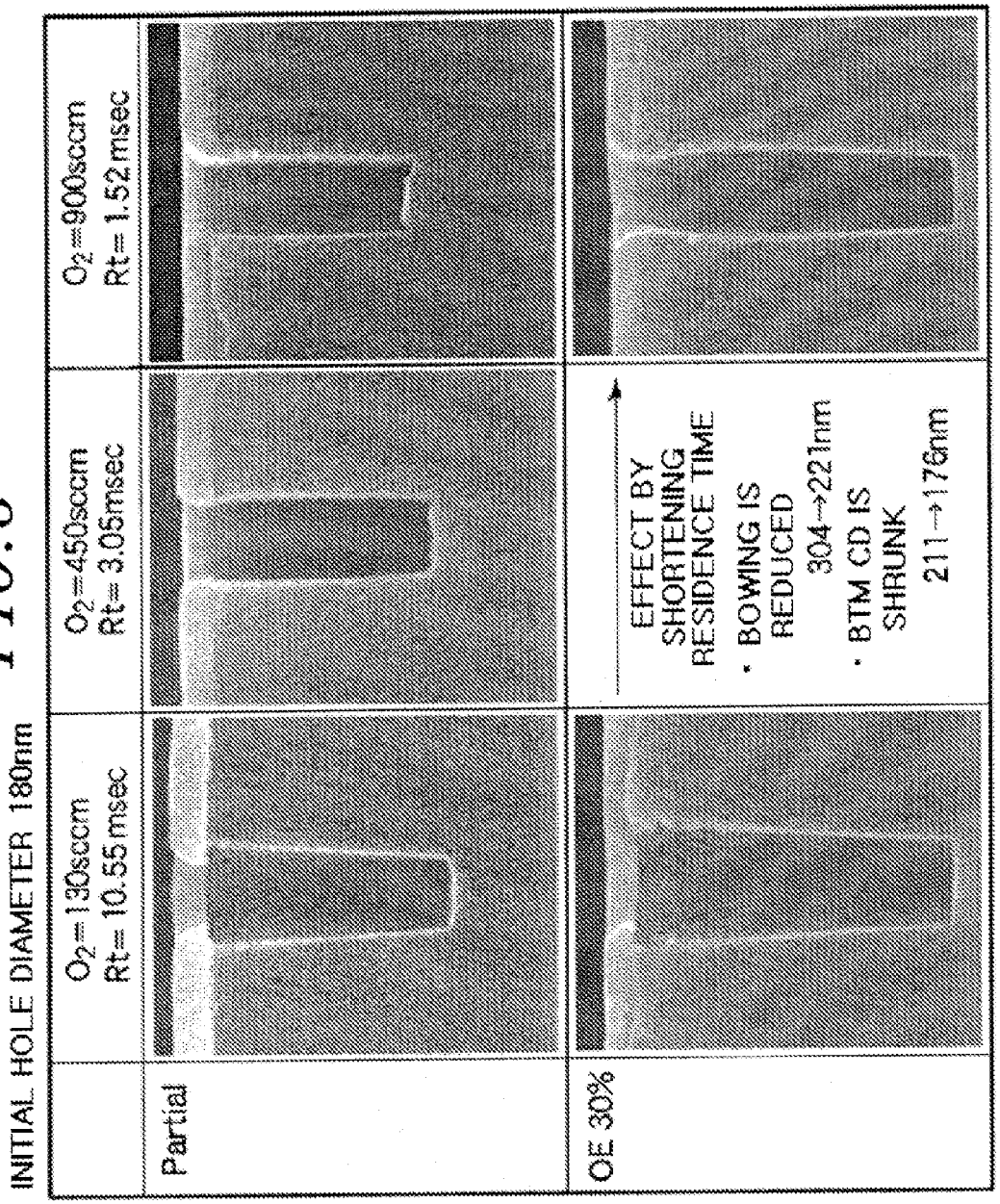
FIG. 6 shows scanning electron microscope pictures of etching holes when an amorphous carbon is etched by setting an initial hole diameter as 180 nm while changing a residence time.

The hole states of the first sample (Partial) created by partially etching the amorphous carbon layer 304 and the second sample (OE 30%) created by over-etching the amorphous carbon layer 304 by 30% were ascertained. FIGS. 5 and 6 show scanning electron microscope (SEM) pictures of the etched holes when the initial hole diameters were set to 120 and 180 nm, respectively.

From FIGS. 5 and 6, it is confirmed that the satisfactorily etched shapes were obtained by reducing the residence time in both cases that the initial hole diameters were 120 and 180 nm. Further, it is confirmed that CD was shrunk by shortening the residence time.

FIG. 7 shows detailed figures of the etched holes. From the first sample (Partial) of the initial hole diameters of 120 and 180 nm, it has been seen that the maximum CD was rapidly decreased by shortening the residence time Rt to 3.05 msec or less, thereby improving the bowing. Further, the average of 100 hole diameters was decreased, and both 3σ and σ/Ave. were decreased by half as the residence time Rt was shortened from 10.55 to 3.05 msec.

In the second sample (OE 30%) corresponding to the actual etching, in the case of the initial hole diameter of 120 nm, maximum CD was reduced from 211 nm to 145 nm as the residence time Rt was shortened from 10.55 msec to 1.52 msec. This shows that the bowing was significantly improved. In addition, 3σ was reduced from 65.08 nm to 33.88 nm and σ/Ave. was also reduced from 0.13 to 0.10. This shows that the etched shape was also improved. Further, bottom CD was shrunk from 133 nm to 100 nm. It is confirmed that the hole diameter was suppressed from being increased.

Similarly, in the second sample (OE 30%) corresponding to the actual etching, in the case of the initial hole diameter of 180 nm, maximum CD was reduced from 304 nm to 221 nm as the residence time Rt was shortened from 10.55 msec to 1.52 msec. This shows that the bowing was significantly improved. In addition, 3σ was reduced from 82.8 nm to 40.2 nm and σ/Ave. was also reduced from 0.11 to 0.07. This shows that the etched shape was also improved. Further, bottom CD was shrunk from 211 nm to 176 nm. It is confirmed that the hole diameter was suppressed from being increased.

In accordance with the present embodiment, since the plasma etching is performed on the amorphous carbon layer by using the $O_2$ gas as the processing gas and allowing the $O_2$ gas to flow in the processing chamber such that the residence time of the $O_2$ gas becomes 0.37 msec or less, the amount of the O radicals become smaller. Accordingly, it is possible to suppress the horizontal directional etching and errors such as bowings in etched shapes or increase of hole diameters or line widths.

Since the O radicals allowing the etching to be horizontally performed are produced by dissociation of the $O_2$ gas, it is possible to make it difficult to dissociate the $O_2$ gas into the O radicals by shortening the residence time of the $O_2$ gas to 0.37 msec or less, to thereby obtain the satisfactory etched shape and the high dimensional accuracy. Until now, the embodiment of the present invention has been described. The present invention is not limited to the above embodiment, and various modifications can be made. For example, in the embodiment described above, the plasma etching method is carried out by the plasma etching apparatus in which two high frequency power having different frequencies are supplied to the lower electrode. The present invention, however, is not limited thereto. The plasma etching method may be carried out by a plasma etching apparatus in which a single plasma-generating high frequency power is supplied to the lower electrode, a high frequency power is supplied to the upper electrode, or a plasma-generating power and a bias high frequency power are supplied to the upper and the lower electrode, respectively.

In addition, in the above embodiment, the etching of the amorphous carbon layer used as a mask has been described. However, the present invention is not limited thereto. The present invention may be applied to any object such as a cylinder, the object itself being used as a practical part. Further, the target substrate to be processed may be various kinds of substrates such as flat panel displays (FPD) without being limited to the semiconductor wafer.

While the invention has been shown and described with respect to the embodiments, it will be understood by those skilled in the art that various changes and modifications may be made without departing from the scope of the invention as defined in the following claims.

What is claimed is:
1. A plasma etching method comprising:
providing a substrate on which an amorphous carbon layer and an inorganic film are formed;
generating a plasma of only $O_2$ gas in a processing chamber; and
performing a plasma etching on the amorphous carbon layer by using the inorganic film as a mask and by using the plasma of only the $O_2$ gas,
wherein the plasma etching is performed while causing the $O_2$ gas to flow in the processing chamber with a residence time ranging from 1.02 msec to 3.05 msec,
wherein the plasma etching is performed at a pressure inside the processing chamber set to be greater than zero and equal to or smaller than 30 mTorr, and
wherein the plasma etching is performed at a flow rate of the $O_2$ gas ranging from 450 sccm to 1350 sccm.

2. The method of claim 1, wherein a diameter of a hole or a width of a groove formed by the plasma etching of the amorphous carbon is equal to or greater than 100 nm and an aspect ratio thereof is equal to or smaller than 7.

3. The method of claim 1, wherein a value calculated by dividing a standard deviation σ of diameters of a hole or widths of a groove by an average hole diameter or groove width Ave. is equal to or smaller than 0.1, wherein the standard deviation σ and the average Ave. are calculated by measuring diameters or widths at a plurality of locations between a top and a bottom portion of a cross sectional shape of the hole or the groove formed by the plasma etching of the amorphous carbon layer.

4. The method of claim 1, wherein the substrate is located between an upper electrode and a lower electrode, and wherein a distance between the upper electrode and the lower electrode ranges from 0.001 m to 0.3 m.

5. The method of claim 1, wherein the inorganic film is a $SiO_2$ film or a spin on glass (SOG) film.

6. A plasma etching method comprising:

providing a substrate on which an amorphous carbon layer and an inorganic film are formed;

generating a plasma of $O_2$ gas in a processing chamber; and performing a plasma etching on the amorphous carbon layer by using the inorganic film as a mask and by using the plasma of the $O_2$ gas, wherein the plasma etching is performed while setting a flow rate of the $O_2$ gas in a range from 450 sccm to 1350 sccm so that a residence time of the $O_2$ gas ranges from 1.02 msec to 3.05 msec, wherein the plasma etching is performed at a pressure inside the processing chamber set to be greater than zero and equal to or smaller than 30 mTorr.

7. The method of claim 6, wherein the substrate is located between an upper electrode and a lower electrode, and wherein a distance between the upper electrode and the lower electrode ranges from 0.001 to 0.3 m.

8. The method of claim 6, wherein the inorganic film is a $SiO_2$ film or a spin on glass (SOG) film.

\* \* \* \* \*